(12) United States Patent
Yang et al.

(10) Patent No.: US 10,262,733 B2
(45) Date of Patent: Apr. 16, 2019

(54) MEMRISTIVE DOT PRODUCT ENGINE FOR VECTOR PROCESSING

(71) Applicant: Hewlett Packard Enterprise Development LP, Houston, TX (US)

(72) Inventors: Jianhua Yang, Palo Alto, CA (US); Miao Hu, Palo Alto, CA (US); John Paul Strachan, San Carlos, CA (US); Ning Ge, Palo Alto, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 3 days.

(21) Appl. No.: 15/325,543

(22) PCT Filed: Oct. 29, 2014

(86) PCT No.: PCT/US2014/062977
§ 371 (c)(1),
(2) Date: Jan. 11, 2017

(87) PCT Pub. No.: WO2016/068920
PCT Pub. Date: May 6, 2016

(65) Prior Publication Data
US 2017/0178725 A1 Jun. 22, 2017

(51) Int. Cl.
*G11C 13/00* (2006.01)
*G06F 3/03* (2006.01)
*G06G 7/16* (2006.01)

(52) U.S. Cl.
CPC ............ *G11C 13/0069* (2013.01); *G06F 3/03* (2013.01); *G06G 7/16* (2013.01); *G11C 13/003* (2013.01);
(Continued)

(58) Field of Classification Search
CPC .................. G11C 13/0069; G11C 13/0065
(Continued)

(56) References Cited

U.S. PATENT DOCUMENTS 5,262,982 A * 11/1993 Brassington ............ G11C 11/22
365/145
7,499,315 B2 3/2009 Lowrey et al.
(Continued)

FOREIGN PATENT DOCUMENTS

WO WO-2013162553 10/2013

OTHER PUBLICATIONS

Yakopcic, Chris, Tarek M. Taha, and Raqibul Hasan. "Hybrid Crossbar Architecture for a Memristor Based Memory." NAECON 2014—IEEE National Aerospace and Electronics Conference (2014): n. pag. Web.*
(Continued)

*Primary Examiner* — Huan Hoang
*Assistant Examiner* — Muna A Techane
(74) *Attorney, Agent, or Firm* — Hewlett Packard Enterprise Patent Department

(57) ABSTRACT

A memristive dot-product system for vector processing is described. The memristive dot-product system includes a crossbar array having a number of memory elements. Each memory element includes a memristor. Each memory element includes a transistor. The system also includes a vector input register. The system also includes a vector output register.

18 Claims, 7 Drawing Sheets

(52) U.S. Cl.
CPC ...... *G11C 13/0021* (2013.01); *G11C 13/0064* (2013.01); *G11C 2213/79* (2013.01)

(58) Field of Classification Search
USPC ........................................................ 365/148
See application file for complete search history.

(56) References Cited

U.S. PATENT DOCUMENTS

| | | | |
|---|---|---|---|
| 8,320,160 B2 | 11/2012 | Nazarian | |
| 8,611,134 B2 | 12/2013 | Carter | |
| 2009/0095985 A1* | 4/2009 | Lee .................. | G11C 13/0007 257/211 |
| 2009/0163826 A1 | 6/2009 | Mouttet | |
| 2013/0028004 A1* | 1/2013 | Snider .................. | G11C 11/406 365/148 |
| 2013/0054886 A1* | 2/2013 | Eshraghian .......... | G11C 15/046 711/108 |
| 2014/0153314 A1 | 6/2014 | Baker et al. | |
| 2014/0166957 A1 | 6/2014 | Yang et al. | |

OTHER PUBLICATIONS

International Searching Authority, The International Search Report and the Written Opinion, dated Jun. 29, 2015, 11 Pages.
Yakopcic, C., et al., Hybrid Crossbar Architecture for a Memristor Based Memory [online], Jan. 16, 2013, IEEE, Retrieved from the Internet on Sep. 27, 2014, 5 Pgs.

* cited by examiner

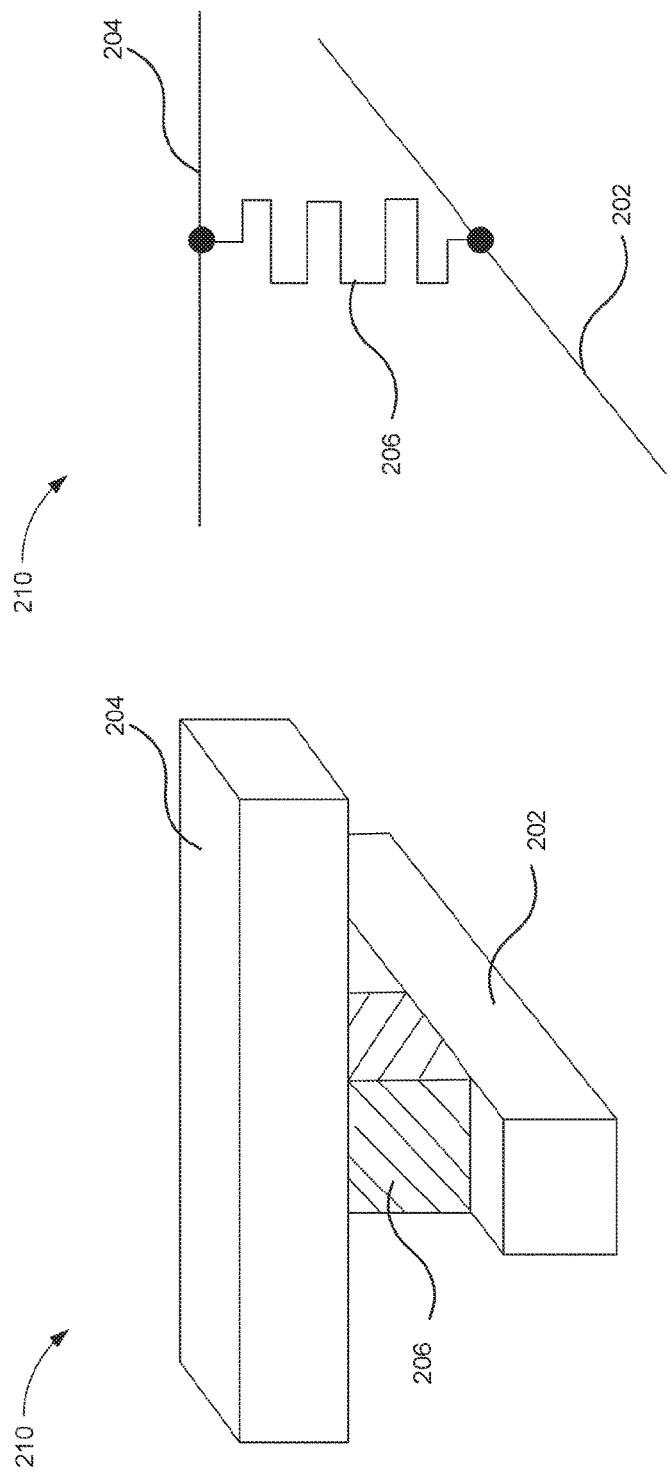

MEMRISTIVE DOT PRODUCT ENGINE FOR VECTOR PROCESSING

BACKGROUND

The need for fast and efficient vector-matrix processing techniques arises in many computing applications. For example, vector-matrix operations are utilized in data-compression, digital data processing, neural networks, encryption and optimization, to name a few.

BRIEF DESCRIPTION OF THE DRAWINGS

The accompanying drawings illustrate various examples of the principles described herein and are a part of the specification. The illustrated examples are merely examples and do not limit the scope of the claims.

DETAILED DESCRIPTION

The need for fast and efficient vector-matrix processing techniques arises in many computing applications. For example, vector-matrix operations are utilized in data-compression, digital data processing, neural networks, encryption and optimization, to name a few. A memristive crossbar array can be used to perform vector-matrix or dot product computations. For example, an input voltage signal from each row of the crossbar is weighted by the conductance of the resistive devices in each column and accumulated as the current output from each column. Ideally, if wire resistances can be ignored, the current vector, I, flowing out of the crossbar array will be approximately $I^T = V^T G$, where V is the input voltage vector and G is the conductance matrix, including contributions from each memristor in the memristive crossbar array.

The use of memristors at each junction or cross-point of the crossbar array enables programming the resistance (or conductance) at each such junction corresponding to the values of G, leading to use of the crossbar array as a dot product engine (DPE). Accuracy and power consumption are generally of concern in the design of dot product engines. The dot-product engines according to the principles described herein include memristive elements that include transistors. The transistors can reduce sneak path currents and provide higher precision in the programming of the conductance values $G_{ij}$, thereby leading to a DPE having improved accuracy and reduced power consumption.

Various examples of the principles disclosed herein are directed to crossbar-memory systems and their use in performing vector-matrix calculations. Memristor crossbar arrays implement matrices and can lead to substantial increases in performance in vector processing when compared to, e.g., graphics processing units or similar accelerators. The low operating energy of memristors can so lead to substantial reductions in power consumption.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Figure 1:
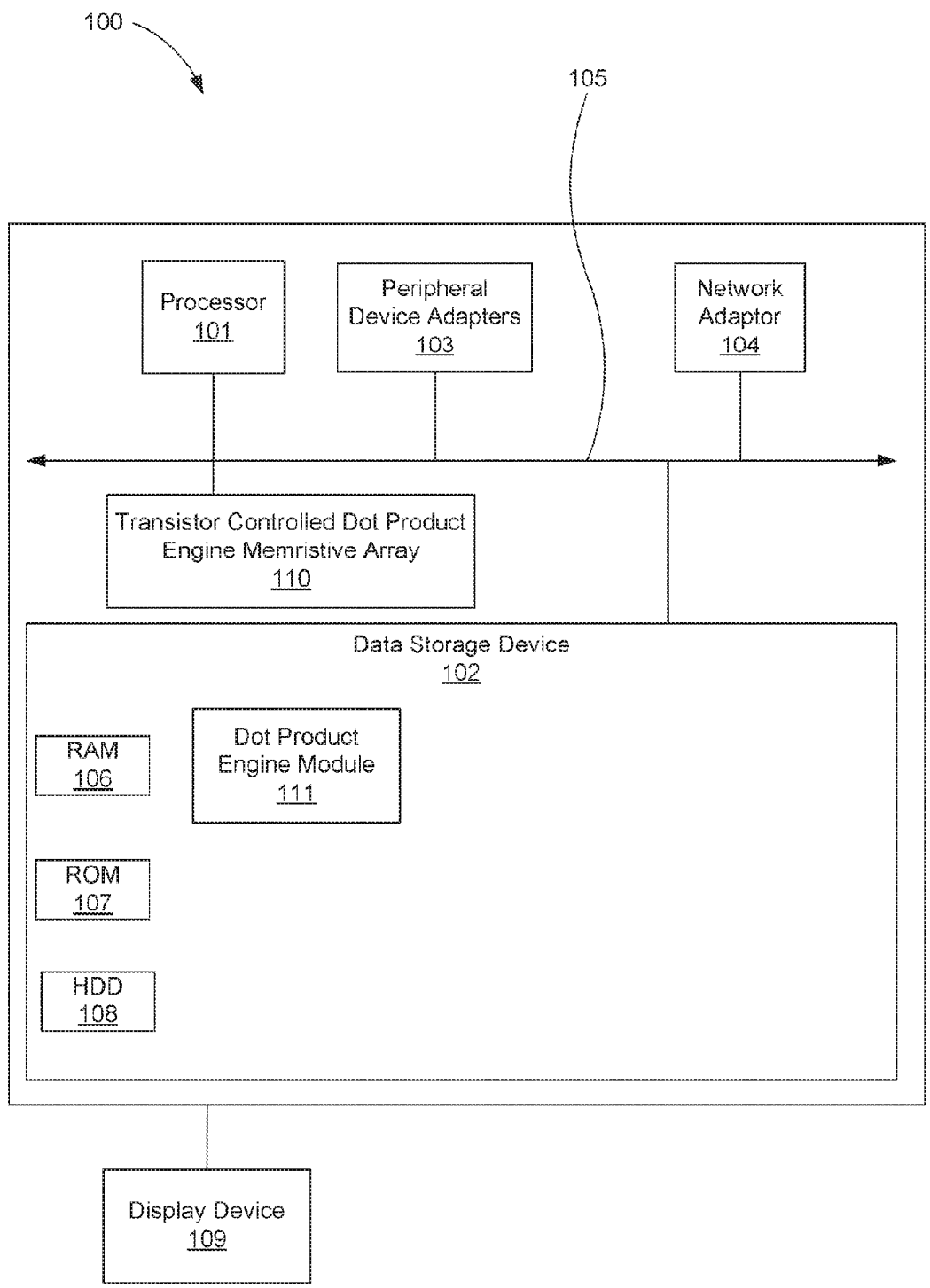
FIG. 1 is a diagram of a computing system for determining a dot product, according to one example of the principles described herein.

Turning now to the figures, FIG. 1 is a diagram of a computing system (100) for determining a dot product, according 1.0 one example of the principles described herein. The computing system (100) may be implemented in an electronic device. Examples of electronic devices include servers, desktop computers, laptop computers, personal digital assistants (PDAs), mobile devices, smartphones, gaming systems, and tablets, among other electronic devices.

The computing system (100) may be utilized in any data processing scenario including, stand-alone hardware, mobile applications, through a computing network, or combinations thereof. Further, the computing system (100) may be used in a computing network, a public cloud network, a private cloud network, a hybrid cloud network, other forms of networks, or combinations thereof. In one example, the methods provided by the computing system (100) are provided as a service over a network by, for example, a third party. In this example, the service may include, for example, the following: a Software as a Service (SaaS) hosting a number of applications; a Platform as a Service (PaaS) hosting a computing platform including, for example, operating systems, hardware, and storage, among others; an Infrastructure as a Service (IaaS) hosting equipment such as, for example, servers, storage components, network, and components, among others; application program interface (API) as a service (APIaaS), other forms of network services, or combinations thereof. The present systems may be implemented on one or multiple hardware platforms, in which the modules in the system can be executed on one or across multiple platforms. Such modules can run on various forms of cloud technologies and hybrid cloud technologies or offered as a SaaS (Software as a service) that can be implemented on or off the cloud. In another example, the methods provided by the computing system (100) are executed by a local administrator.

To achieve its desired functionality, the computing system (100) includes various hardware components. Among these hardware components may be a number of processors (101), a number of data storage devices (102), a number of peripheral device adapters (103), and a number of network adapters (104). These hardware components may be interconnected through the use of a number of busses and/or network connections. In one example, the processor (101), data storage device (102), peripheral device adapters (103), and a network adapter (104) may be communicatively coupled via a bus (105).

The processor (101) may include the hardware architecture to retrieve executable code from the data storage device (102) and execute the executable code. The executable code may, when executed by the processor (101), cause the processor (101) to implement at least the functionality of applying a number of first voltages to a corresponding number of row lines within a memristive cross-bar array to change the resistive values of a corresponding number of memristors located at junctions between the row lines and a number of column lines, the first voltages representing a corresponding number of values within a matrix, respectively. The executable code may, when executed by the processor (101), also cause the processor (101) to implement at least the functionality of applying a number of second voltages to a corresponding number of row lines within a memristive cross-bar array, the second voltages representing a corresponding number of vector values. The executable code may, when executed by the processor (101), further cause the processor (101) to implement at least the functionality of collecting the output currents from the column lines, the collected output currents representing the dot product. The functionality of the computing system (100) is in accordance to the methods of the present specification described herein. In the course of executing code, the processor (101) may receive input from and provide output to a number of the remaining hardware units.

The data storage device (102) may store data such as executable program code that is executed by the processor (101) or other processing device. As will be discussed, the data storage device (102) may specifically store computer code representing a number of applications that the processor (101) executes to implement at least the functionality described herein.

The data storage device (102) may include various types of memory modules, including volatile and nonvolatile memory. For example, the data storage device (102) of the present example includes Random Access Memory (RAM) (106), Read Only Memory (ROM) (107), and Hard Disk Drive (HDD) memory (108). Many other types of memory may also be utilized, and the present specification contemplates the use of many varying type(s) of memory in the data storage device (102) as may suit a particular application of the principles described herein. In certain examples, different types of memory in the data storage device (102) may be used for different data storage needs. For example, in certain examples the processor (101) may boot from Read Only Memory (ROM) (107), maintain nonvolatile storage in the Hard Disk Drive (HDD) memory (108), and execute program code stored in Random Access Memory (RAM) (106).

The data storage device (102) may include a computer readable medium, a computer readable storage medium, or a non-transitory computer readable medium, among others. For example, the data storage device (102) may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (103, 104) in the computing system (100) enable the processor (101) to interface with various other hardware elements, external and internal to the computing system (100). For example, the peripheral device adapters (103) may provide an interface to input/output devices, such as, for example, display device (109), a mouse, or a keyboard. The peripheral device adapters (103) may also provide access to other external devices such as an external storage device, a number of network devices such as, for example, servers, switches, and routers, client devices, other types of computing devices, and combinations thereof.

The display device (109) may be provided to allow a user of the computing system (100) to interact with and implement the functionality of the computing system (100). The peripheral device adapters (103) may also create an interface between the processor (101) and the display device (109), a printer, or other media output devices. The network adapter (104) may provide an interface to other computing devices within, for example, a network, thereby enabling the transmission of data between the computing system (100) and other devices located within the network.

The computing system (100) may, when executed by the processor (101), display the number of graphical user interfaces (GUIs) on the display device (109) associated with the executable program code representing the number of applications stored on the data storage device (102). The GUIs may display, for example, interactive screenshots that allow a user to interact with the computing system (100) to input matrix and vector values in association with a transistor controlled dot product engine (DPE) memristive array (110) as will be described in more detail below. Additionally, via making a number of interactive gestures on the GUIs of the display device (109), a user may obtain a dot product value based on the input data. Examples of display devices (109) include a computer screen, a laptop screen, a mobile device screen, a personal digital assistant (FDA) screen, and a tablet screen, among other display devices (106).

The computing system (100) may further include a transistor controlled DPE memristive array (110) having transistors incorporated into the memory elements. As will be described in more detail below, the transistor controlled DPE memristive array (110) includes a number of elements including a number of memristors that function together within an array to perform a weighted sum of multiple inputs. Transistors incorporated into the memory elements control the current levels flowing through the memristors. The transistor controlled DPE memristive array (110) may be used in a number of applications. For example, the transistor controlled DPE memristive array (110) may be used as a threshold logic gate (TLG) to perform a matrix product to compare the output with a threshold. Thus, the transistor controlled DPE memristive array (110) may be used as an accelerator in which the transistor controlled DPE memristive array (110) performs a number of functions faster than is possible in software running on a more general-purpose processing device. Although the transistor controlled DPE memristive array (110) is depicted as being a device internal to the computing system (100), in another example, the transistor controlled DPE memristive array (110) may be a peripheral device coupled to the computing system (100) or included within a peripheral device coupled to the computing system (100).

The computing system (100) further includes a number of modules used in the implementation of the systems and methods described herein. The various modules within the computing system (100) include executable program code that may be executed separately. In this example, the various modules may be stored as separate computer program products. In another example, the various modules within the computing system (100) may be combined within a number of computer program products; each computer program product including a number of the modules.

The computing system (100) may include a dot product engine module (111) to, when executed by the processor (101), assist in the functionality of the transistor controlled DPE memristive array (110). The dot product engine module (111), for example, receives a number of input values defining a matrix to be processed in a dot product mathematical calculation. The dot product engine module (111) may send the input values to the transistor controlled DPE memristive array (110) as programming signals to a number of memristors within the transistor controlled DPE memristive array (110) to program the memristors. The dot product engine module (111) may also receive a vector input to be processed in connection with the matrix programmed into the memristors. The dot product engine module (111) may further obtain a value representing the dot product, and convey that value as data to the computing system (100) or another computing device for analysis or further processing.

Figure 2A:
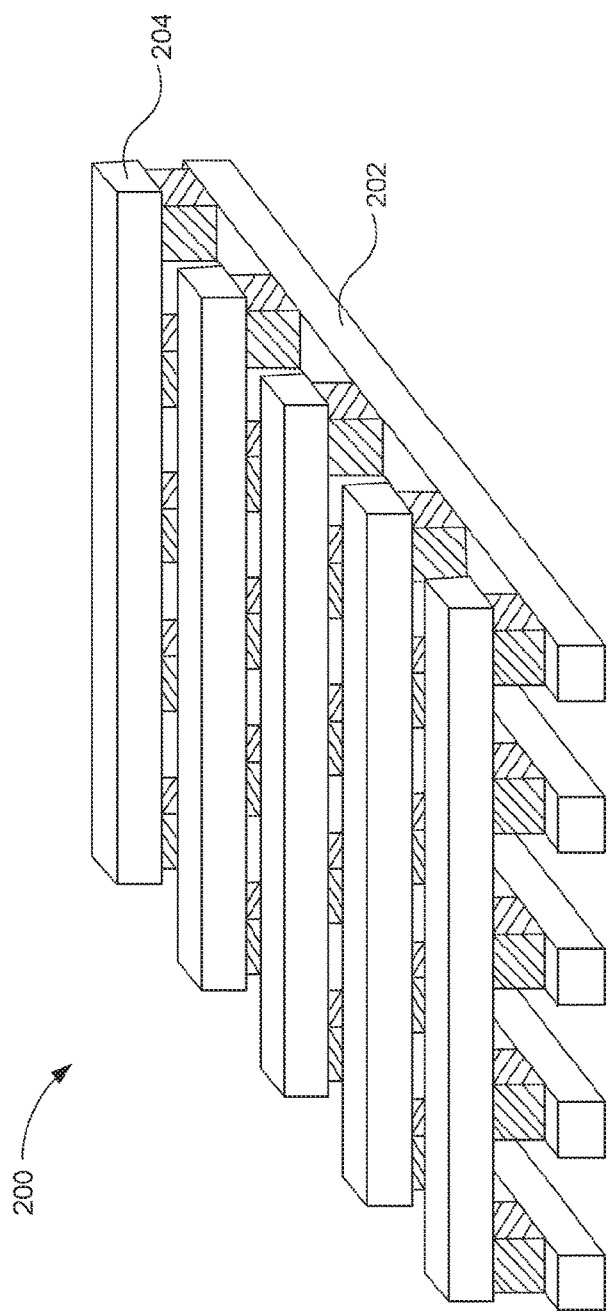
FIGS. 2A, B and C are diagrams of a crossbar array having a memristive device positioned at each crosspoint or junction of the crossbar array to one example of the principles disclosed herein.

FIGS. 2A, B and C illustrate a crossbar array (200) having a memristive device positioned at each crosspoint or junction of the crossbar array according to one example of the principles disclosed herein. In FIG. 2A, a first layer of approximately parallel electrodes (202) is overlain by a second layer of approximately parallel electrodes (204). For simplicity, one of the first layer of parallel electrodes (202) and one of the second layer of parallel electrodes (204) is indicated with a reference number. The second layer of electrodes (204) is roughly perpendicular, in orientation, to the electrodes (202) of the first layer, although the orientation angle between the layers may vary. The two layers of electrodes (202, 204) form a lattice, or crossbar, each electrode (204) of the second layer overlying the electrodes (202) of the first layer and coming into close contact with each electrode (202) of the first layer at electrode intersections that represent the closest contact between two electrodes (202, 204). Given the lattice orientation, the first layer of electrodes (202) may be described as columns, while the second layer of electrodes (204) may be described as rows. Although individual electrodes (202, 204) in FIG. 2A are shown with rectangular cross sections, electrodes can also have square, circular, elliptical, or more complex cross sections. The electrodes may also have many different widths or diameters and aspect ratios or eccentricities. The term "crossbar" may refer to crossbars having a layer or layers of sub-microscale wires, microscale wires, or wires with larger dimensions, in addition to electrodes.

At electrode intersections, electronic components, such as resistors, and other electronic components, can be fabricated to interconnect two overlapping electrodes (202, 204). An electrode intersection connected by electronic components is sometimes called a "crossbar junction." FIGS. 2B and 2C provide two different illustrations of a crossbar junction (210) that interconnects electrode columns (202) and rows (204) of two contiguous layers within a crossbar array. The crossbar junction (210) may or may not involve physical contact between the two electrodes (202, 204). As shown in FIG. 2B, the two electrodes (202, 204) are not in physical contact at their overlap point, but the gap between the electrodes (202, 204) is spanned by a memristive element (206) that lies between the two electrodes at their closest overlap point. FIG. 2C illustrates a schematic representation of the memristive element (206) and overlapping electrodes (202, 204) shown in FIG. 2B. The memristive element (206) is used to represent a memristor and any associated circuitry located at a crossbar junction throughout the remaining figures.

Figure 3:
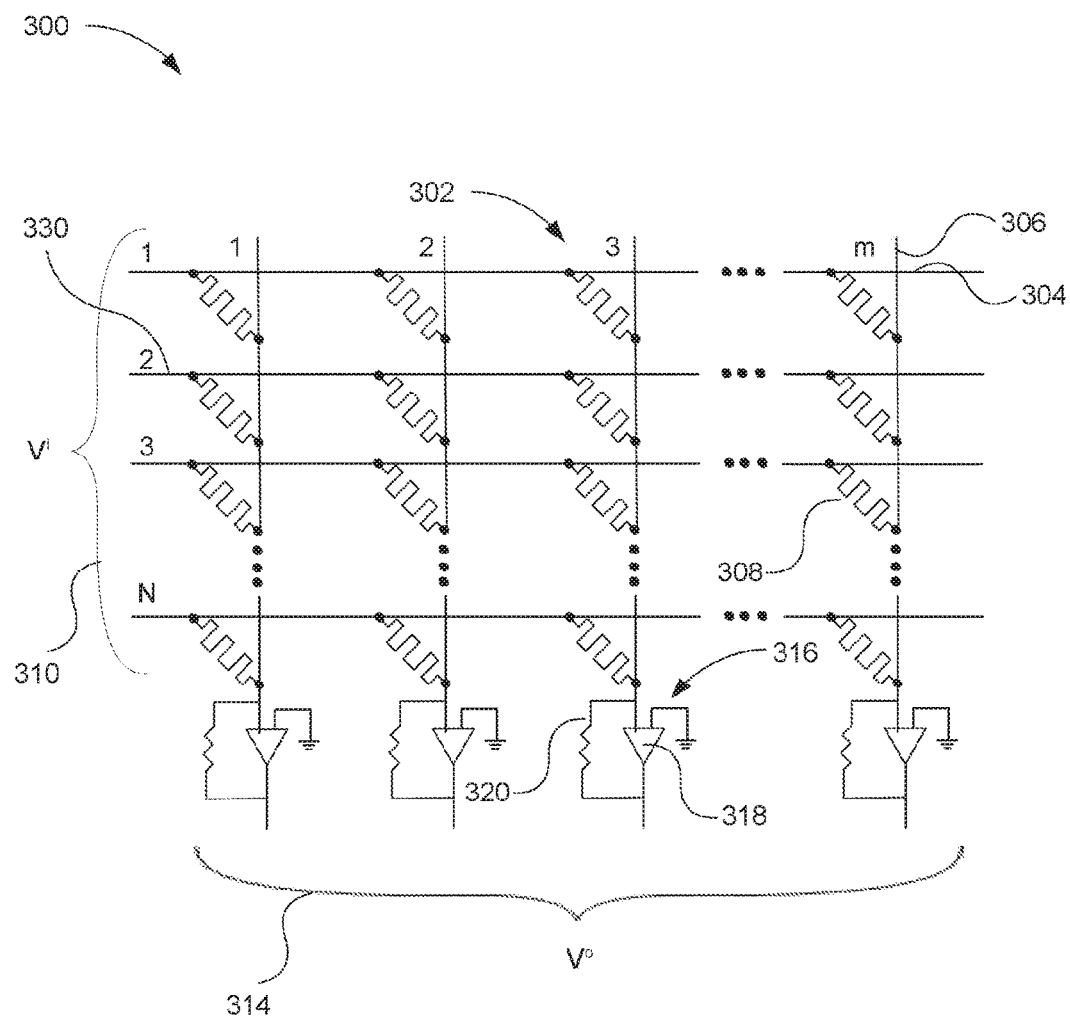
FIG. 3 is a diagram of a memristive dot-product engine according to one example of the principles disclosed herein.

FIG. 3 illustrates a memristive dot-product engine (300) having a single vector of voltage inputs according to one example of the principles disclosed herein. The dot-product engine (300) includes a crossbar array (302) including N row electrodes (304) and M column electrodes (306). The crossbar junctions throughout the crossbar array (302) include a memristive element (308). The dot-product engine (300) includes a vector input register or vector input (310) for applying voltages to the row electrodes (304) and a vector output register or vector output (314) for receiving output voltages resulting from current flows in the column electrodes (306). The dot-product engine (300) also includes sense circuitry (316) for converting an electrical current in a column electrode (306) to a voltage. In an example of the principles described herein, the sense circuitry (316) includes an operational amplifier (318) and a resistor (320), which can be arranged to represent a virtual ground for read operations.

The dot-product engine (300) may also include other peripheral circuitry associated with crossbar arrays (302) used as storage devices. For example, the vector input (310) may include drivers connected to the row electrodes (304). An address decoder can be used to select a row electrode (304) and activate a driver corresponding to the selected row electrode (304). The driver for a selected row electrode (304) can drive a corresponding row electrode (304) with different voltages corresponding to a vector-matrix multiplication or the process of setting resistance values within the memristive elements (308) of the crossbar array (302). Similar driver and decoder circuitry may be included for the column electrodes (306). Control circuitry may also be used to control application of voltages at the inputs and reading of voltages at the outputs of the dot-product engine (300). Digital to analog circuitry and analog to digital circuitry may be used at the vector inputs (310) and at the vector output (314). Input signals to the row electrodes (304) and column electrodes (306) can be either analog or digital. The peripheral circuitry above described can be fabricated using semiconductor processing techniques in the same integrated structure or semiconductor die as the crossbar array (302) in the above example. As described in further detail below, there are two main operations that occur during operation of the dot-product engine. The first operation is to program the memristors in the crossbar array so as to map the mathematic values in an N×M matrix to the array. In one example, only one memristor is programmed at a time during the programming operation. The second operation is the dot-product or matrix multiplication operation. In this operation, input voltages are applied and output voltages obtained, corresponding to the result of multiplying an N×M matrix by an N×1 vector. The input voltages are below the threshold of the programming voltages so the resistance values of the memristors in the array (302) are not changed during the matrix multiplication operation.

In one example of dot-product engine operation according to the principles described herein, vector and matrix multiplications may be executed through the dot-product engine (300) by applying a set of voltages $V^I$ (310) simultaneously along the rows (304) of the N×M crossbar array (302) and collecting the currents through the columns (306) and measuring the output voltage $V^O$ (314). On each column, every input voltage (310) is weighted by the corresponding memristance ($1/G_{ij}$) and the weighted summation is reflected at the output voltage (314). Using Ohm's law, the relation between the input voltages (310) and output voltages (314) can be represented by a vector matrix multiplication of the form: $\{V^O\}^T = -\{V^I\}^T [G] R_S$, where $G_{ij}$ is an N×M matrix determined by the conductance (inverse of resistance) of the crossbar array (302), $R_S$ is the resistance value of the sense amplifiers and T denotes the transpose of the column vectors $V^O$ and $V^I$. The negative sign follows from use of a negative feedback operational amplifier in the sense amplifiers. From the foregoing, it follows that the dot-product engine (300) can be utilized for vector processing and, more specifically, for multiplying a first vector of values $\{b_i\}^T$ by a matrix of values $[a_{ij}]$ to obtain a second vector of values $\{c_i\}^T$, where i=1,N and j=1,M. The vector operation can be set forth in more detail as follows.

$$a_{11}b_1 + a_{21}b_2 + \ldots + a_{N1}b_N = c_1$$
$$\ldots$$
$$a_{1M}b_1 + a_{2M}b_2 + \ldots + a_{NM}b_N = c_M.$$

The vector processing or multiplication using the principles described herein generally starts by mapping a matrix of values $[a_{ij}]$ onto the crossbar array (302) or, stated otherwise, programming—e.g., writing—conductance values $G_{ij}$ into the crossbar junctions of the array (302). With reference still to FIG. 3, in one example, each of the conductance values $G_{ij}$ is set by sequentially imposing a voltage drop over each of the crossbar junctions (FIG. 2, 210). For example, the conductance value $G_{2,3}$ may be set by applying a voltage equal to $V_{Row2}$ at the $2^{nd}$ row of the crossbar array (302) and a voltage equal to $V_{Col3}$ at the $3^{rd}$ column of the array (302). Referring to FIG. 3, in one example, the voltage input, $V_{Row2}$, will be applied to the $2^{nd}$ row at a location (330) occurring at the $2^{nd}$ row electrode adjacent the j=1 column electrode. The voltage input, $V_{Col3}$, will be applied to the $3^{rd}$ column electrode adjacent either the i=1 or i=N location. Note that when applying a voltage at a column electrode (306), the sense circuitry (316) for that electrode may be switched out and a voltage driver switched in. The voltage difference $V_{Row2} - V_{Col3}$ will generally determine the resulting conductance value $G_{2,3}$ based on the characteristics of the memristive element (308) located at the intersection. When following this approach, the unselected columns (306) and rows may be addressed according to one of several schemes, including, for example, floating all unselected columns (306) and rows (304) or grounding all unselected columns (306) and rows (304). Other schemes involve grounding columns (306) or grounding partial columns (306). Grounding all unselected columns (306) and rows (304) is beneficial in that the scheme helps to isolate the unselected columns (306) and rows (304) to minimize the sneak path currents to the selected output column (306). Following programming, operation of the dot-product engine (300) proceeds by applying the vector of input voltages (310) and reading the vector of output voltages (314).

In accordance with one example of the principles disclosed herein, the memristors used for the dot product engines (300) have a linear current-voltage relation. Linear current-voltage relations permit higher accuracy in the vector multiplication process. However, crossbar arrays (302) having linear memristors are prone to having large sneak path currents during programming of the array (302), particularly when the size of the crossbar array (302) is larger than a certain size, for instance, 32×32. In such cases, the current running through a selected memristor may not be sufficient to program the memristor because most of the current runs through the sneak paths. Alternatively, the memristor may be programmed at an inaccurate value because of the sneak paths. To alleviate the sneak path currents in such instances, and especially when larger arrays are desired, an access device, such as a non-linear selector or transistor (e.g., a normally ON depletion mode transistor) may be incorporated within or utilized together with the memristive element (308) to minimize the sneak path currents in the array. More specifically, the memristive element (308) should be broadly interpreted to include memristive devices including, for example, a memristor, a memristor and selector, or a memristor and transistor.

Figure 4:
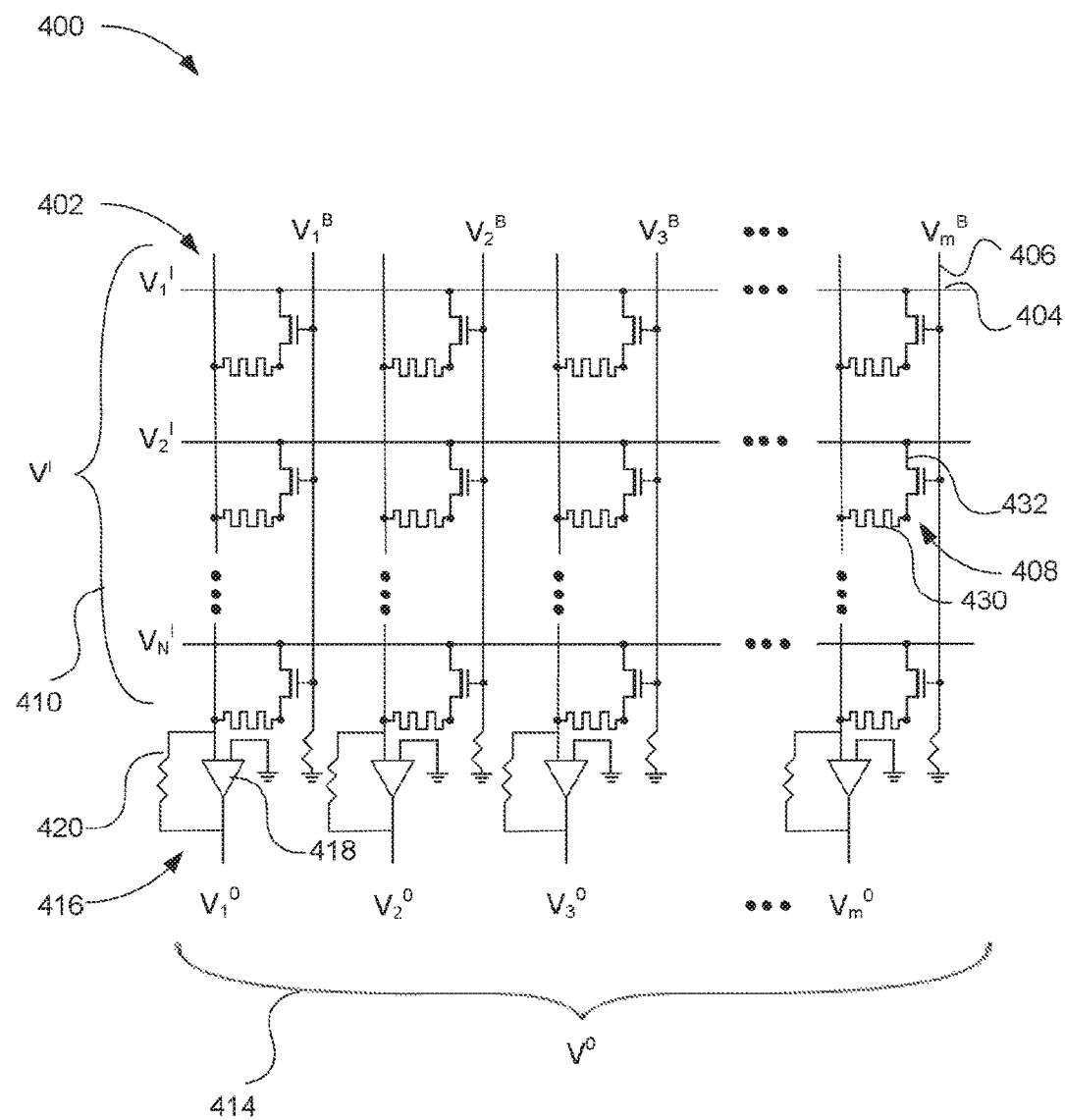
FIG. 4 is a diagram of a memristive dot-product engine with transistors according to one example of the principles disclosed herein.

The dot-product engines according to the principles described herein include memristive elements that include transistors. The transistors can reduce the sneak path currents and provide higher precision in the programming of the conductance values $G_{ij}$. FIG. 4 illustrates an alternative crossbar array (402) used in a vector processor or dot-product engine (400) according to an example of the principles described herein. The dot-product engine (400) includes a crossbar array (402) including N row electrodes (404) and M column electrodes (406). The crossbar junctions throughout the crossbar array (402) include a memristive element (408). The memristive element (408), in one example, includes a memristor (430) and a transistor (432). In one example of the principles described herein, the transistor (432) is a depletion mode transistor, in the normally ON mode under zero electrical bias.

For memory applications, a common transistor, e.g., an enhancement-mode transistor is used. According to the principles described herein, however, depletion-mode transistors are employed in various examples. For example, enhancement-mode metal-oxide semiconductor field-effect transistors (MOSFETs) are normally OFF where the gate-source voltage is biased to zero volts or ground, and can be turned on by pulling the gate voltage in the direction of the drain voltage; that is, toward the VDD supply rail, which is positive for an n-channel MOSFET (NMOS) logic and negative for p-channel MOSFET (PMOS) logic. In a depletion-mode MOSFET, the device is normally ON at zero gate-source voltage. Such devices are used as load "resistors" in logic circuits (in depletion-load NMOS logic, for example). For N-type depletion-mode devices, the threshold voltage may be about −3 V, so it may be turned OFF by pulling the gate 3 V negative (the drain, by comparison, is more positive than the source in NMOS). In a PMOS, the polarities are reversed. The transistors are only activated when programming the memristors to map the mathematic matrix, which is a much less frequent operation than the dot-product operation. Therefore, for the dot-product engine (400), the transistors (432) remain in their conducting state, i.e., ON state without gate bias, which can significantly reduce the total energy cost. Low resistance in the ON state of the transistors (432) is also beneficial. In general, the ON state resistance of the transistors (432) is lower than that of the memristors (430). When programming a selected memristor (430), all the access transistors (432) are turned OFF by gate biasing except for the transistors (432) in the column (406) with the selected memristor (430). The sneak path currents can thus be reduced.

Still referring to FIG. 4, the dot-product engine (400) includes a vector input register or vector input (410) for applying voltages to the row electrodes (404) and a vector output register or vector output (414) for receiving output voltages resulting from current flows in the column electrodes (406). The dot-product engine (400) also includes sense circuitry (416) for converting an electrical current in a column electrode (406) to a voltage. In one example, the sense circuitry (416) may include an operational amplifier (418) and a resistor (420) that can be arranged to provide a virtual ground circuit.

The dot-product engine (400) may also include other peripheral circuitry associated with crossbar arrays used as storage devices. For example, the vector input (410) may include drivers connected to the row electrodes (404). An address decoder can be used to select a row electrode (404) and activate a driver corresponding to the selected row electrode (404). The driver for a selected row electrode (404) may drive a corresponding row electrode (4040 with different voltages corresponding to a vector-matrix multiplication or the process of setting resistance values within the memristive elements (408) of the crossbar array (402). Similar driver and decoder circuitry may be included at the vector output (414). Control circuitry may also be used to control application of voltages at the rows (404) and columns (406) and the reading of voltages at the outputs of the dot-product engine (400). Digital to analog and analog to digital circuitry may be used at both the vector inputs (410) and outputs (414). The peripheral circuitry above described can be fabricated using semiconductor processing techniques in the same integrated structure or semiconductor die as the crossbar array (402) in the above example.

Dot-product engines having transistors (432) in the crossbar array (402) permits the use of memristors (430) having linear voltage-current characteristics for storing the matrix of conductance values $G_{ij}$ in the crossbar junctions of the array. With reference still to FIG. 4, in one example that includes use of normally ON transistors (432), each of the conductance values $G_{ij}$ is set by sequentially imposing a voltage drop over each of the crossbar junctions (FIG. 2, 210), similar to that described above with reference to FIG. 3. For example, the conductance value $G_{2,3}$ may be set by applying a voltage equal to $V_{Row2}$ at the $2^{nd}$ row of the crossbar array (402) and a voltage equal to $V_{Col3}$ at the $3^{rd}$ column of the array (402). Note that when applying a voltage at a column electrode (406), the sense circuitry (416) for that electrode may be switched out and a voltage driver switched in. The voltage difference $V_{Row2}-V_{Col3}$ will generally determine the resulting conductance value $G_{2,3}$ based on the characteristics of the memristive element (408) located at the intersection. In order to isolate the memristive element (408) being programmed, according to one example, the gate voltage electrode, $V_i^B$, at each of the unselected columns is set to a non-zero bias which, for normally ON transistors (432), has the effect of turning OFF the current flow through the transistor (432). An input voltage, $V_i^I$, is then applied to the selected row electrode (404), while unselected row electrodes are grounded or allowed to float. In this manner of programming—i.e., using transistors (432) coupled with linear memristors (430)—sneak path currents can be greatly reduced or even eliminated. During dot-product engine operations, no gate voltage is needed for any normally ON transistor (432). Only when the memristor array is being programmed to represent a new N×M matrix of values, are non-zero voltages applied to the transistor gates. However, the programming operation occurs much less frequently than the dot-product operation to the array; therefore, using normally ON transistors (432) can significantly lower the operation energy.

Figure 5:
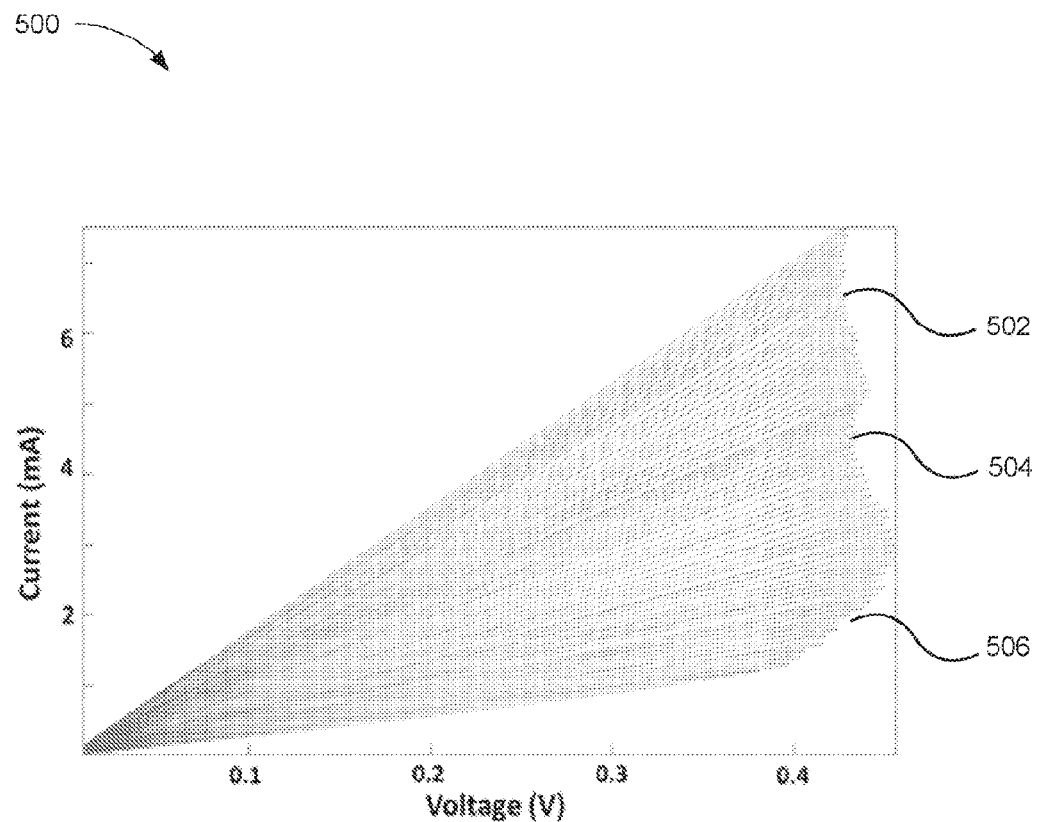
FIG. 5 is a graph of a series of resistance levels used to program a crossbar array according to values contained in an N×M array matrix according to one example of the principles disclosed herein.

Referring now to FIG. 5, a graph illustrates an exemplar series of resistance levels (500) used to program a crossbar array (FIG. 4, 402) according to values contained in an N×M array matrix according to one example of the principles disclosed herein. The graph indicates 64 discrete levels of resistance levels, $R_{ij}(G_{ij}=1/R_{ij})$ that may be programmed into each memristor (FIG. 4, 430) of a crossbar array (FIG. 4, 402), including exemplar first, second and third resistance levels (502, 504, 506) as indicated in the graph. For example, one of the first, second and third resistance levels (502, 504, 506) could be programmed into the memristor (FIG. 4, 430) located at the $2^{nd}$ row and $3^{rd}$ column of the array (FIG. 4, 402). Responding to a voltage input of, for example, 0.4 volts, the current contribution of the memristor (FIG. 4, 430) to the output voltage would approximately equal 6, 4 or 2 mA, depending on which of the first, second and third resistance levels (502, 504, 506) was programmed into the memristor. Generally, higher values of resistance (lower values of conductance) correspond with lower values—e.g., lower numerical values in the N×M array matrix G. In an example according to the principles described herein, Pt/TaO$_x$/Ta memristive devices are used to achieve discrete levels of resistance for use with dot-product engines. Further, by using different gate voltages at the transistors (FIG. 4, 432), different current levels are allowed for the memristor programming, resulting in different conductance levels of the memristors (FIG. 4, 430). This is one manner in which the conductance levels of the memristors (FIG. 4, 430) can be accurately controlled with the transistors (FIG. 4, 432) connected in series with the memristors (FIG. 4, 430).

Mapping of a matrix onto the memristor crossbar array (FIG. 4, 402) includes programming (writing) resistance values into the memristors (FIG. 4, 430) of the crossbar array (FIG. 4, 402) with high bit precision. The goal is to achieve high bit precision and repeatability during the programming of memristor resistance levels. The ability to attain a high number of bits depends broadly on two aspects: (i) the magnitude of the resistance swing achievable in the memristors (FIG. 4, 430) (e.g., the "OFF/ON ratio") and (ii) the capability of attaining distinct and sharply distributed resistance levels during the programming operation. Success in the first aspect involves memristor materials engineering and development to increase the possible resistance swing. For the second aspect, two separate approaches are used. The first approach involves a circuit feedback operation, and the second involves a tunable current compliance controlled by a depletion mode transistor. These two approaches can be utilized simultaneously as well. There are a number of feedback operations for improving programming accuracy. A simple example is a "write then verify" operation. In this case, pulses are applied until the memristive device reaches a desired resistance level, such as a minimum resistance during OFF-switching and a maximum resistance during ON-switching. Improved distributions are seen when any programming overshoot is compensated by then utilizing pulses of the opposite polarity, in this way setting a target resistance and error tolerance. These feedback approaches can lead to nearly arbitrarily high state accuracy, with the cost of increased programming time.

As for the second approach, for accurate hit precision during programming, current compliance with integrated transistors may be used. The added transistors add an area cost to the implementation, but allow higher bit precision, in addition to ultimately allowing for much larger array sizes (e.g. >256×256) to be achieved since unselected bits can be turned OFF with this transistor (FIG. 4, 432). As an example, shown in FIG. 5, by simply using a current compliance imposed by a common semiconductor parameter analyzer, 64 resistance levels have been achieved from $TaO_x$ memristors. With some device design to enlarge the resistance ratio and using integrated transistors with lower parasitics, more resistance levels and thus better bit precision may be achieved. A negligible energy cost may result during the dot-product operation if "normally ON" depletion mode transistors are utilized.

Figure 6:
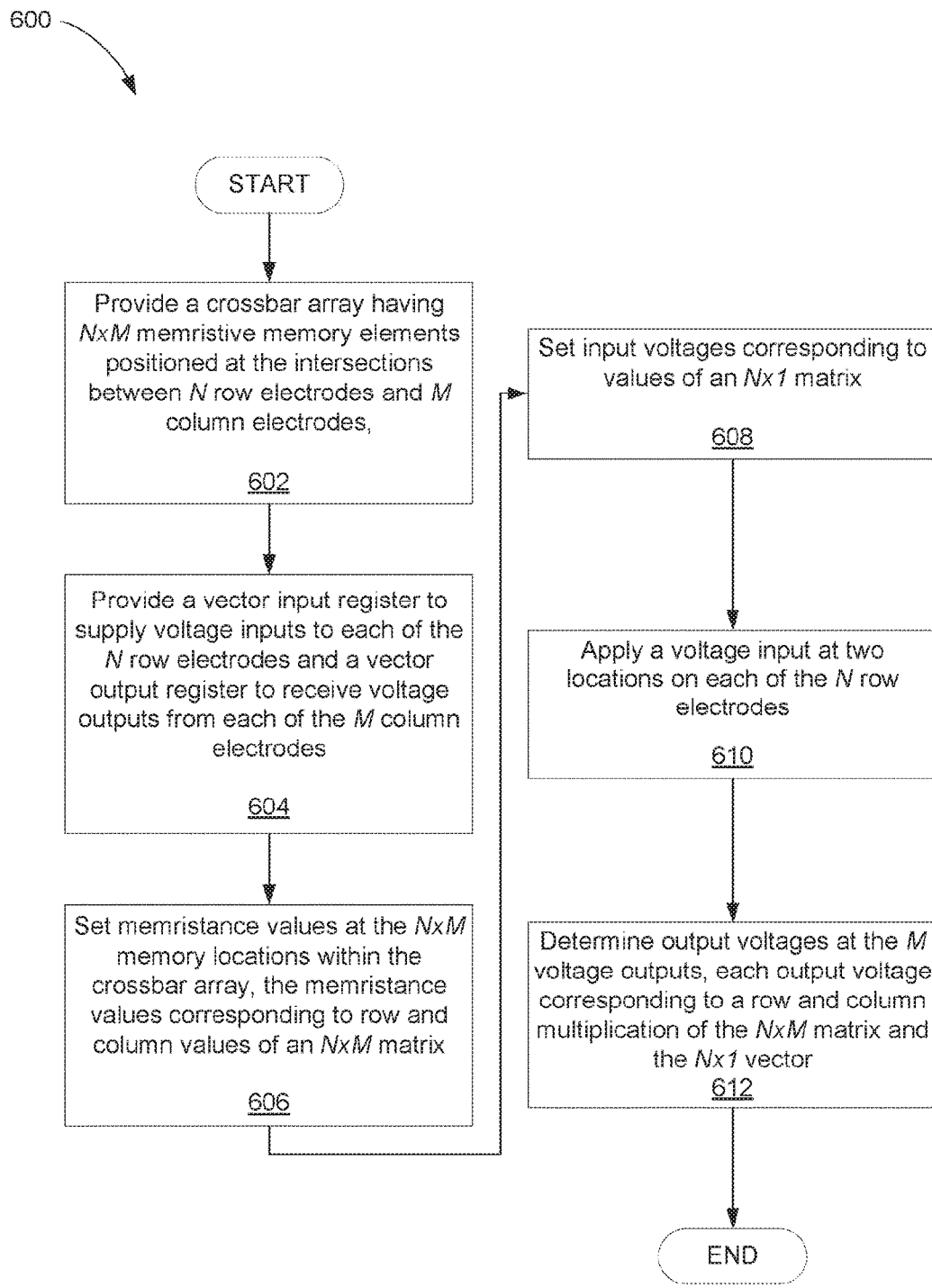
FIG. 6 is a flowchart showing a method for vector processing using a memristive dot product engine having a crossbar array according to one example of the principles described herein.

Referring now to FIG. 6, a method (600) for vector-processing using a memristive dot product engine (FIG. 4, 400) having a crossbar array (FIG. 4, 402) according to one example of the principles described herein is illustrated. According to certain examples, the method (600) may include providing (block 602) a crossbar array (FIG. 4, 402) of memristive storage devices. For example, the crossbar array (FIG. 4, 402) may include N row electrodes (FIG. 4, 404) and M column electrodes (FIG. 4, 406) to form a N×M grid of memory elements. The intersection of each row electrode (FIG. 4, 404) and column electrode (FIG. 4, 406) defines the memory element, which memory element includes a memristive storage device (FIG. 4, 430) and a transistor (FIG. 4, 432). The method (600) also includes providing (block 604) a vector input register (FIG. 4, 410) and vector output register (FIG. 4, 414). For example, a vector input register (FIG. 4, 410) supplies a voltage input to each of the N row electrodes (FIG. 4, 404). A vector output register (FIG. 4, 414) receives voltage outputs from each of the M column electrodes (FIG. 4, 404). The method (600) may further include setting (block 606) memristance values at the N×M memory locations within the crossbar array (FIG. 4, 402), the memristance values corresponding to row and column values of an N×M matrix. For example, programming voltages may be sequentially applied to the row and column electrodes (FIG. 4, 404, 406) corresponding to the crossbar junctions of the N×M memory locations within the array (FIG. 4, 402). Programming currents may be adjusted using the transistor (FIG. 4, 432) located at each memory element. The method (600) may further include setting (block 608) input voltages corresponding to values of an N×1 matrix. The input voltages represent the values of the N×1 matrix to be multiplied against the N×M matrix of values. The method (600) may further include applying (block 610) a voltage input to each of the N row electrodes (FIG. 4, 404). Finally, the method (600) may include determining (block 612) output voltages at the M voltage outputs (FIG. 4, 414). Each output voltage corresponds to a row and column multiplication of the N×M matrix and the N×1 vector. In some examples, determining (block 612) output voltages may include multiplication by a resistive network that includes the resistor (FIG. 4, 420). In one example, the voltage outputs may be determined using sense circuitry (FIG. 4, 416) that passes a current flowing through a column electrode (FIG. 4, 406) through a resistance, thereby allowing the voltage to be determined using Ohm's Law.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (FIG. 1, 101) of the computing system (FIG. 1, 100) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The preceding description has been presented to illustrate and describe examples of the principles described. This description is not intended to be exhaustive or to limit these principles to any precise form disclosed. Many modifications and variations are possible in light of the above teaching.

What is claimed is:

1. A memristive dot product system for vector processing, comprising:
   a crossbar array having a number of memory elements, each memory element comprising a memristor and a transistor in series with one another;
   a vector input register; and
   a vector output register.

2. The system of claim 1, in which the crossbar array comprises N rows, M columns and N×M memory elements.

3. The system of claim 2, in which the input register comprises N voltage inputs to the crossbar array and the output register receives M voltage outputs from the crossbar array.

4. The system of claim 2, in which the N×M memory elements correspond with values contained in an N×M matrix.

5. The system of claim 1, further comprising a normally ON depletion mode transistor at each memory element.

6. The memristive dot product system of claim 1, wherein the memristor of each memory element has a plurality of conductance levels greater than two.

7. The memristive dot product system of claim 6, wherein the transistor of each memory element has a plurality of different gate voltages corresponding to the conductance levels.

8. The memristive dot product system of claim 7, wherein the memristor of each memory element is programmable via a plurality of different current levels controlled by the different gate voltages of the transistor of the memory element.

9. A memristive dot-product engine for vector processing, comprising:
   a crossbar array comprising a number of memory locations, each memory location comprising a memory element to store information corresponding to a value contained in an N×M matrix and a transistor to control current flow through the memory element, an end of the memory element connected to an end of the transistor such that no electrical component is connected at a location between the end of the memory element and the end of the transistor;
   an input register comprising N voltage inputs, each voltage input corresponding to a value contained in a vector having N values; and
   an output register comprising M voltage outputs.

10. The dot-product engine of claim 9, wherein the transistors are normally ON transistors.

11. The dot-product engine of claim 10, further comprising M bias voltage wires, in which a jth wire (j=1,M) is connected to the gates of the normally ON transistors comprising a jth column of memory locations.

12. The dot-product engine of claim 11, in which the normally ON transistors are depletion mode transistors.

13. The dot-product engine of claim 11, in which the memory elements comprising a jth column of memory locations are linear memristors.

14. A method for vector-processing using a memristive dot product engine, comprising:
   providing a crossbar array comprising M columns, N rows and N×M memory locations, each memory location comprising a memristor and a transistor, an input register comprising N voltage inputs, and an output register comprising M voltage outputs, the memristor and the transistor in series with one another with no electrical component connected at a location between the memristor and the transistor;
   setting memristance values at the N×M memory locations within the crossbar array, the memristance values corresponding to row and column values of an N×M matrix, wherein the memristance value at memory location Ni,Mj is set by applying a programming voltage across the memristor at memory location Ni,Mj;
   setting input voltages at the N voltage inputs, the input voltages corresponding to values of an Nx1 vector to be multiplied with the N×M matrix;
   determining output voltages at the M voltage outputs, each output voltage corresponding to the current output at each of the M columns of the crossbar array; and
   representing the Mx1 vector result of the multiplication of the N×M matrix and the Nx1 vector.

15. The method of claim 14, wherein the M voltage outputs are determined by passing current outputs at each of the M columns of the crossbar array through a resistance device.

16. The method of claim 14, wherein the series of steps of setting memristance values at the N×M memory locations within the crossbar array, setting input voltages at the N voltage inputs, and determining output voltages at the M voltage outputs is performed iteratively until a convergence criteria is satisfied.

17. The method of claim 14, wherein each memory element further comprises a transistor to switch on and off current flow through the memristor.

18. The method of claim 14, wherein the transistor at a memory location Ni,Mj is a normally ON depletion mode transistor.

* * * * *